(12) United States Patent
Huang et al.

(10) Patent No.: US 11,632,861 B2
(45) Date of Patent: Apr. 18, 2023

(54) METHOD FOR MANUFACTURING EMBEDDED CIRCUIT BOARD, EMBEDDED CIRCUIT BOARD, AND APPLICATION

(71) Applicant: SHENNAN CIRCUITS CO., LTD., Shenzhen (CN)

(72) Inventors: Lixiang Huang, Shenzhen (CN); Zedong Wang, Shenzhen (CN); Hua Miao, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 121 days.

(21) Appl. No.: 17/135,981

(22) Filed: Dec. 28, 2020

(65) Prior Publication Data

US 2022/0015243 A1    Jan. 13, 2022

Related U.S. Application Data

(63) Continuation of application No. PCT/CN2020/127018, filed on Nov. 6, 2020.

(30) Foreign Application Priority Data

Jul. 7, 2020   (CN) .......................... 202010645946.9

(51) Int. Cl.
*H05K 3/14*   (2006.01)
*H05K 1/11*   (2006.01)
(Continued)

(52) U.S. Cl.
CPC ........... *H05K 3/143* (2013.01); *H05K 1/0298* (2013.01); *H05K 1/111* (2013.01); *H05K 1/115* (2013.01);
(Continued)

(58) Field of Classification Search
CPC ...... H05K 1/0298; H05K 1/111; H05K 1/115; H05K 1/183; H05K 1/185; H05K 1/188;
(Continued)

(56) References Cited

U.S. PATENT DOCUMENTS

2006/0291173 A1   12/2006   Cho et al.
2008/0210459 A1    9/2008   Lin
(Continued)

FOREIGN PATENT DOCUMENTS

CN         1886026 A    12/2006
CN       101018456 A     8/2007
(Continued)

OTHER PUBLICATIONS

WO 2015127489 A1 Translation (Year: 2022).*
(Continued)

*Primary Examiner* — Hog C Nguyen
*Assistant Examiner* — John B Freal

(57) ABSTRACT

The invention, which relates to the technical field of circuit boards, specifically discloses a method for manufacturing an embedded circuit board, an embedded circuit board, and an application thereof. The method includes: providing a substrate, wherein an electronic component is embedded in the substrate, a pad is arranged on a side surface of the electronic component, and an end surface of the pad is flush with a same side surface of the substrate; forming a metallic layer on a side surface of the substrate adjacent to the pad by sputtering, evaporation, electroplating or chemical vapor deposition; and patterning the metallic layer to obtain a circuit board covered with the metallic layer on the pad, wherein the metallic layer on the pad protrudes beyond the same side surface of the substrate.

11 Claims, 7 Drawing Sheets

(51) Int. Cl.
*H05K 1/18* (2006.01)
*H05K 3/06* (2006.01)
*H05K 3/16* (2006.01)
*H05K 3/18* (2006.01)
*H05K 1/02* (2006.01)
*H05K 3/40* (2006.01)

(52) U.S. Cl.
CPC ............. *H05K 1/183* (2013.01); *H05K 1/185* (2013.01); *H05K 3/061* (2013.01); *H05K 3/146* (2013.01); *H05K 3/16* (2013.01); *H05K 3/188* (2013.01); *H05K 3/4038* (2013.01); *H05K 2201/0183* (2013.01)

(58) Field of Classification Search
CPC ... H05K 1/09; H05K 1/11; H05K 1/18; H05K 1/0271; H05K 2201/0183; H05K 2201/0338; H05K 2201/0195; H05K 2201/0317; H01L 23/49822; H01L 23/49827
See application file for complete search history.

(56) References Cited

U.S. PATENT DOCUMENTS

2009/0237900 A1* 9/2009 Origuchi ............ H01L 23/49838
361/763
2014/0339699 A1* 11/2014 Arvin ................ H01L 21/76885
257/738
2015/0028461 A1* 1/2015 Gatterbauer ............ H01L 24/05
257/751
2015/0357254 A1* 12/2015 Mikami .................. H01L 21/52
257/773

FOREIGN PATENT DOCUMENTS

| CN | 101039552 A | 9/2007 | |
|---|---|---|---|
| CN | 101364581 A | 2/2009 | |
| CN | 106256019 A | 12/2016 | |
| CN | 109712894 A | 5/2019 | |
| EP | 3836209 A1 | 6/2021 | |
| WO | WO-2015127489 A1 * | 9/2015 | ............ H01L 21/56 |
| WO | WO2015127489 A1 | 9/2015 | |

OTHER PUBLICATIONS

International search report, International Application No. PCT/CN2020/127018, dated Jul. 4, 2021 (17 pages).
European search report, European Application No. 20827991.9, dated Apr. 8, 2022 (10 pages).
Chinese first office aciion, Application No. 202010645946.9, dated Feb. 15, 2023(16 pages).

* cited by examiner

METHOD FOR MANUFACTURING EMBEDDED CIRCUIT BOARD, EMBEDDED CIRCUIT BOARD, AND APPLICATION

CROSS-REFERENCE TO RELATED APPLICATIONS

The present disclosure is a continuation-application of International (PCT) Patent Application No. PCT/CN2020/127018 filed Nov. 6, 2020, which claims foreign priority of Chinese Patent Application No. 202010645946.9, filed on Jul. 7, 2020 in the State Intellectual Property Office of China, the contents of all of which are hereby incorporated by reference.

TECHNICAL FIELD

The present disclosure relates to the technical field of circuit boards, and particularly to a method for manufacturing an embedded circuit board, an embedded circuit board, and an application thereof.

BACKGROUND ART

As publicly known, a number of metals with optimal conductivity are silver, copper, gold, and aluminum, respectively. In the electronics industry, especially in the circuit board industry, costly gold and silver among the above-mentioned metals with optimal conductivity are rarely used in the circuit board industry. Current semiconductor manufacturers usually use aluminum foils as pad materials of electronic component to quickly dissipate heat generated when the electronic component are in operation, and use copper foils as copper circuit layer materials.

However, during the long-term research and development process, the inventor of the present application has found an aluminum-copper alloy are easy to obtained when welding an aluminum foil pad and a copper circuit layer. However, high resistance of the aluminum-copper alloy may cause high operating energy consumption and great heat generation quantity of the circuit board, thereby seriously affecting stability of the circuit board product and thus failing to meet different product performance requirements of users.

SUMMARY OF THE INVENTION

The present disclosure provides a method for manufacturing an embedded circuit board and an embedded circuit board.

In a first aspect, the present disclosure provides a method for manufacturing an embedded circuit board. The method includes: providing a substrate, wherein an electronic component is embedded in the substrate, a pad is arranged on a side surface of the electronic component, and an end surface of the pad is flush with a same side surface of the substrate; forming a metallic layer on a side surface of the substrate adjacent to the pad by use of a sputtering process, an evaporation process, an electroplating process or a chemical vapor deposition process; and patterning the metallic layer to obtain a circuit board covered with the metallic layer on the pad, wherein the metallic layer on the pad protrudes beyond the same side surface of the substrate.

In a second aspect, the present disclosure provides a method for manufacturing an embedded circuit board. The method may include: providing a substrate, wherein an electronic component is embedded in the substrate, a pad is arranged on a side surface of the electronic component, and an end surface of the pad is flush with a same side surface of the substrate; forming a metallic layer on a side surface of the substrate adjacent to the pad; and patterning the metallic layer to obtain a circuit board covered with the metallic layer on the pad, wherein the metallic layer on the pad protrudes beyond the same side surface of the substrate.

In a third aspect, the present disclosure provides an embedded circuit board, including: a substrate defining a slot; an electronic component received in the slot, wherein a pad is arranged on a side surface of the electronic component, and an end surface of the pad is flush with a same side surface of the substrate; and a metallic layer at least covering the pad, wherein the metallic layer protrudes beyond the same side surface of the substrate.

Technical solution provided by the present disclosure may achieve the following advantageous effects.

BRIEF DESCRIPTION OF THE DRAWINGS

In order to clearly illustrate the technical solutions in the embodiments of the present disclosure, drawings required to be used in the description of the embodiments will be briefly introduced below. Apparently, the drawings in the following description are only some embodiments of the present disclosure, and according to these drawings, persons ordinarily skilled in the art may further obtain other drawings without expending inventive labor.

DETAILED DESCRIPTION

The technical solutions in the embodiments of the present disclosure will be clearly and completely described below in conjunction with the drawings in the embodiments of the present disclosure. Obviously, the embodiments described are merely a part of the embodiments of the present disclosure, rather than all the embodiments. All other embodiments obtained by those ordinarily skilled in the art based on the embodiments of the present disclosure without expending inventive labor fall into the protection scope of the present disclosure.

All the directional indicators (such as upper/above, lower/below, left, right, before, after and the like) in the embodiments of the present disclosure are merely used to explain relative positional relations, motions and the like between respective components in a specific posture (as shown in the figures concerned). If the specific posture varies, the directional indicators will vary accordingly. In addition, the terms "including/comprising" and "having" and any variations thereof are intended to cover non-exclusive inclusion. For example, a process or method that includes a series of steps or units is not confined to the listed steps or units, but optionally further includes steps or units that are not listed, or optionally further includes other steps or units inherent to the process or method.

Figure 1:
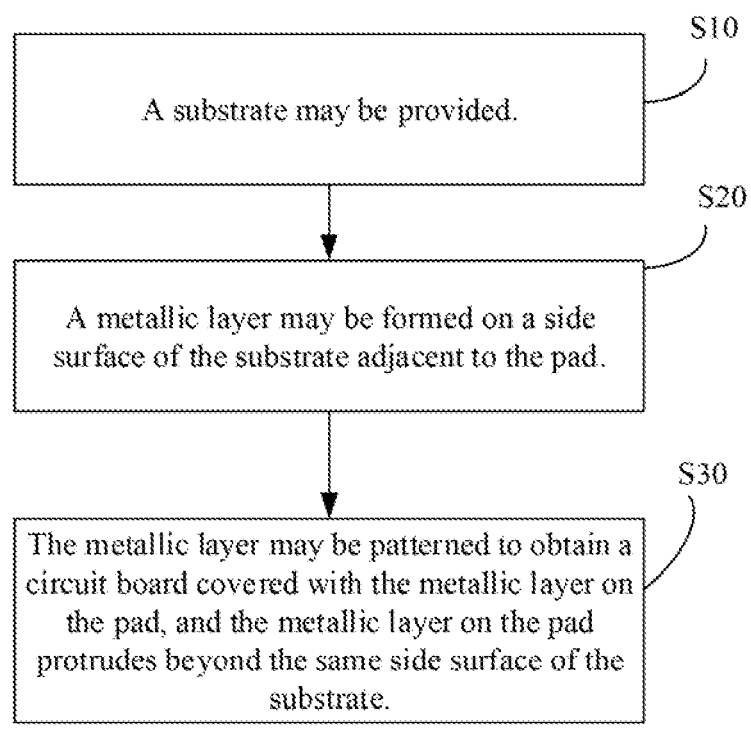
FIG. 1 is a schematic flowchart of a first embodiment of a method for manufacturing an embedded circuit board according to the present disclosure.

With reference to FIG. 1, the present disclosure provides a method for manufacturing an embedded circuit board. The method includes the following operations.

At block S10, a substrate may be provided. An electronic component is embedded in the substrate. Therein, a pad is arranged on a side surface of the electronic component, and an end surface of the pad is flush with a same side surface of the substrate.

Specifically, the substrate may be a single-layer plate or a multi-layer plate. The single-layer plate may be a copper-free core plate or a copper clad plate, and the multi-layer plate may be directly manufactured by laminating a plurality of copper-free core plates or copper clad plates. The purpose of choosing a copper-free core plate as the substrate is to thicken the embedded circuit board to embed the electronic component with a sufficient thickness. Of course, a copper clad plate can also be chosen as the substrate. The copper clad plate may be provided with a circuit for circuit connection.

The substrate defines a slot for receiving the electronic component A size of the slot may be determined according to a size of the electronic component to be received. Generally, the size of the slot may be greater than that of the electronic component. To be specific, the size of the slot in the thickness direction of the substrate may be greater than that of the electronic component. Thus, the substrate may provide protection for the electronic component during subsequent treatment, by reducing a pressure applied to the electronic component during the treatment process. The size of the slot in a direction perpendicular to the thickness direction of the substrate may be greater than the size of the electronic component such that the electronic component may be precisely received in the slot without being damaged.

The pad is arranged on a side surface of the electronic component, and an end surface of the pad is flush with a same side surface of the substrate. The pad is configured to connect the electronic component and a circuit layer in the embedded circuit board.

At block S20, a metallic layer may be formed on a side surface of the substrate adjacent to the pad.

A metallic layer is formed on a side surface of the substrate adjacent to the pad by sputtering, evaporation, electroplating or chemical vapor deposition.

At block S30, the metallic layer may be patterned to obtain a circuit board covered with the metallic layer on the pad, and the metallic layer on the pad protrudes beyond the same side surface of the substrate.

Figure 6:
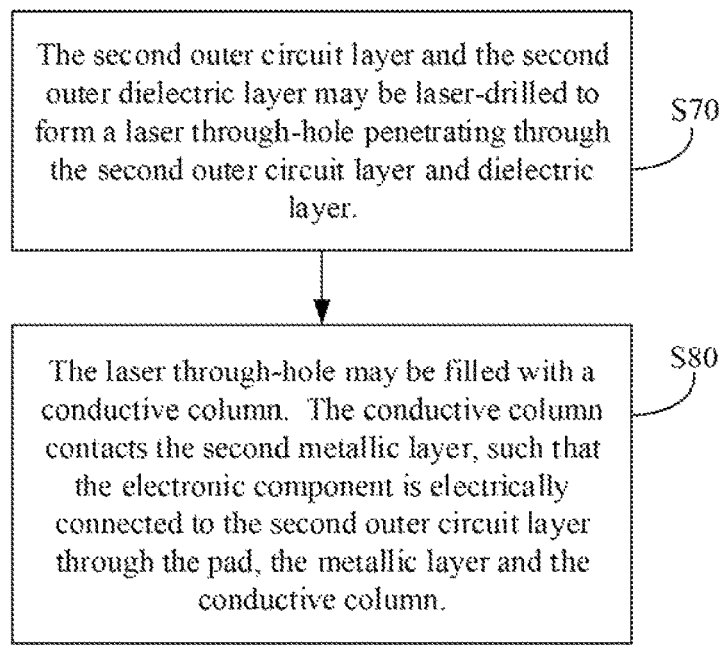
FIG. 6 is a schematic flowchart of a fourth embodiment of a method for manufacturing an embedded circuit board according to the present disclosure.
Figure 7:
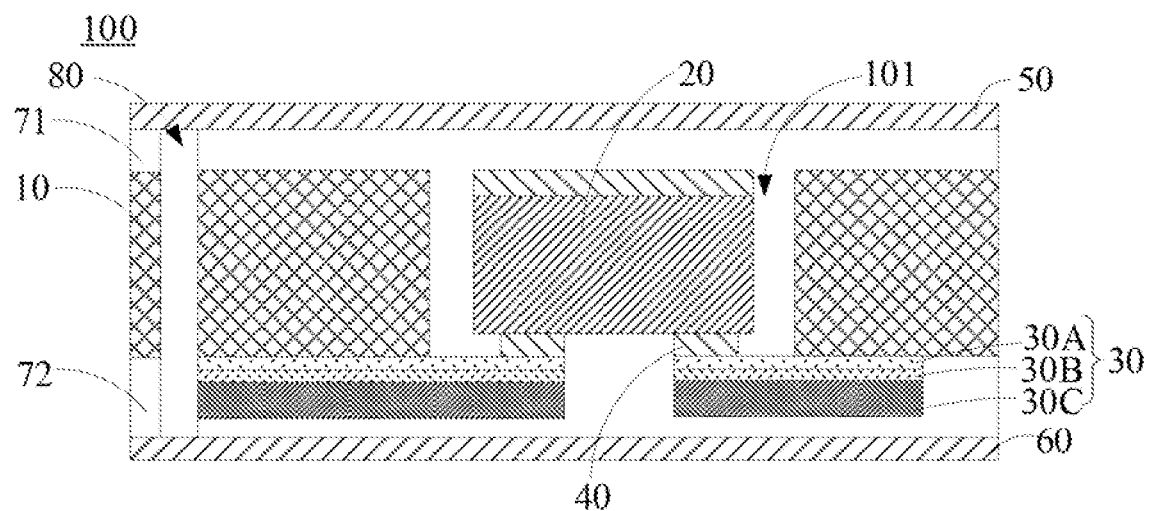
FIG. 7 is a schematic structural diagram of a first embodiment of an embedded circuit board according to the present disclosure.

The metallic layer is patterned by photolithography, wet etching or dry etching to form a patterned metallic layer as shown in FIG. 6 or FIG. 7. The metallic layer at least covers the pad and protrudes beyond the same side surface of the substrate.

In the present disclosure, The metallic layer is formed on a side surface of a substrate adjacent to a pad. The metallic layer is patterned to obtain a circuit board covered with the metallic layer on the pad. Through a secondary processing of the pad on the substrate according to user requirements, thereby an embedded circuit board meeting users' different product performance requirements is manufactured. For example, an isolation metallic layer is formed on an aluminum foil pad and then a copper circuit layer is formed on the isolation metallic layer, such that the aluminum foil pad and the copper circuit layer are avoided from being directly welded to form an aluminum-copper alloy with great resistance, thereby achieving the effect of better heat dissipation of the electronic component and manufacturing an embedded circuit board that meets the users' heat dissipation requirements.

In an embodiment, the metallic layer on the pad protrudes beyond the same side surface of the substrate by Sum. Preferably, the metallic layer on the pad protrudes beyond the same side surface of the substrate by 5 um to 13 um. More preferably, the metallic layer on the pad protrudes beyond the same side surface of the substrate by 8 um.

Figure 2:
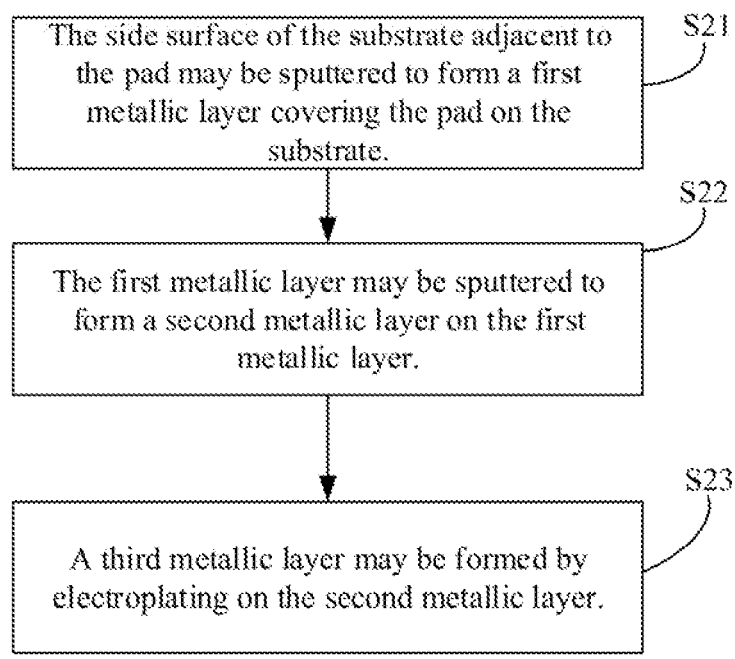
FIG. 2 is a schematic flowchart of a step S20 in FIG. 1.

With reference to FIG. 2, the above operations at block S20 may include the following.

At block S21, the side surface of the substrate adjacent to the pad may be sputtered to form a first metallic layer covering the pad on the substrate.

A material of the aforementioned pad is aluminum. A first metallic layer covering the pad is formed on the side surface of the substrate adjacent to the pad by sputtering, evaporation, electroplating or chemical vapor deposition. A material of the first metallic layer is titanium, and a thickness of the first metallic layer is 0.1 um to 0.2 um.

At block S22, the first metallic layer may be sputtered to form a second metallic layer on the first metallic layer.

A second metallic layer is formed on the first metallic layer by sputtering, evaporation, electroplating or chemical vapor deposition. The second metallic layer may be made of copper. A thickness of the second metallic layer may range from 0.3 um to 0.8 um. The second metallic layer has excellent conductivity and stable chemical properties.

At block S23, a third metallic layer may be formed by electroplating on the second metallic layer.

A third metallic layer is formed on the second metallic layer by sputtering, evaporation, electroplating or chemical vapor deposition. The third metallic layer may be made of copper. A thickness of the third metallic layer may range from 5 um to 11 um. The third metallic layer has excellent conductivity and stable chemical properties.

In the present embodiment, an isolated titanium layer is formed on the aluminum foil pad, and then a copper circuit layer is formed on the isolated titanium layer to avoid forming the aluminum copper alloy with high resistance by direct welding of the aluminum foil pad and the copper circuit layer. Thus, better heat dissipation effect for electronic devices may be achieved, and an embedded circuit board meeting the heat dissipation requirements of users may be manufactured.

Figure 3:
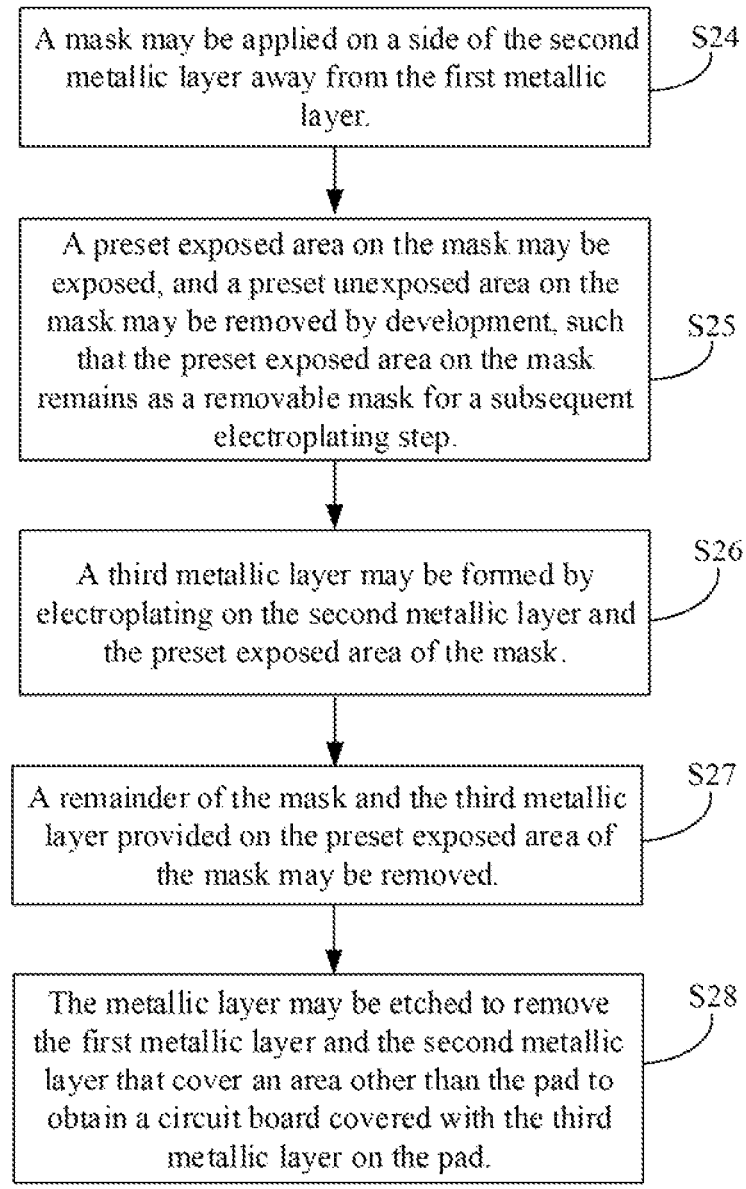
FIG. 3 is a schematic flowchart of a step S30 in FIG. 1.

With reference to FIG. 3, the above operations at block S20 may include the following.

At block S24, a mask may be applied on a side of the second metallic layer away from the first metallic layer.

Mask production is carried out on the second metallic layer, and a mask is formed only on a surface of the second metallic away from the first metallic layer. The mask produced covers a surface of the second metallic layer away from the pad.

At block S25, a preset exposed area on the mask may be exposed, and a preset unexposed area on the mask may be removed by development, such that the preset exposed area on the mask remains as a removable mask for a subsequent electroplating step.

The mask includes a preset exposed area and a preset unexposed area. The preset unexposed area covers the second metallic layer corresponding to the pad. In the operations, after the preset exposed area is exposed, the developer can be used to develop the preset unexposed area, and the mask of the preset unexposed area can be removed to retain the preset exposed area on the mask.

At block S26, a third metallic layer may be formed by electroplating on the second metallic layer and the preset exposed area of the mask.

A third metallic layer is formed on the second metallic layer and the preset exposed area on the mask by sputtering, evaporation, electroplating or chemical vapor deposition. The third metallic layer may be made of copper. A thickness of the third metallic layer may range from 5 um to 11 um. The third metallic layer has excellent conductivity and stable chemical properties.

At block S27, a remainder of the mask and the third metallic layer provided on the preset exposed area of the mask may be removed.

A remainder of the mask is peeled off, and the third metallic layer disposed on the preset exposed area of the mask is removed.

At block S28, the metallic layer may be etched to remove the first metallic layer and the second metallic layer that cover an area other than the pad to obtain a circuit board covered with the third metallic layer on the pad.

The metallic layer of the entire board may be etched. Since the first metallic layer, the second metallic layer, and the third metallic layer are arranged on an area corresponding to the pad, the metallic layer on the area corresponding to the pad is relatively thick, and at least a part of the third metallic layer is retained subsequent to the etching. The area other than the pad is covered only with the first metallic layer and the second metallic layer. Therefore, the metallic layer on the area other than the pad is relatively thin.

At block S28, both the first metallic layer and the second metallic layer covering the area other than the pad are removed by etching, and finally only the metallic layer covering the area corresponding to the pad remains as a circuit layer.

Figure 4:
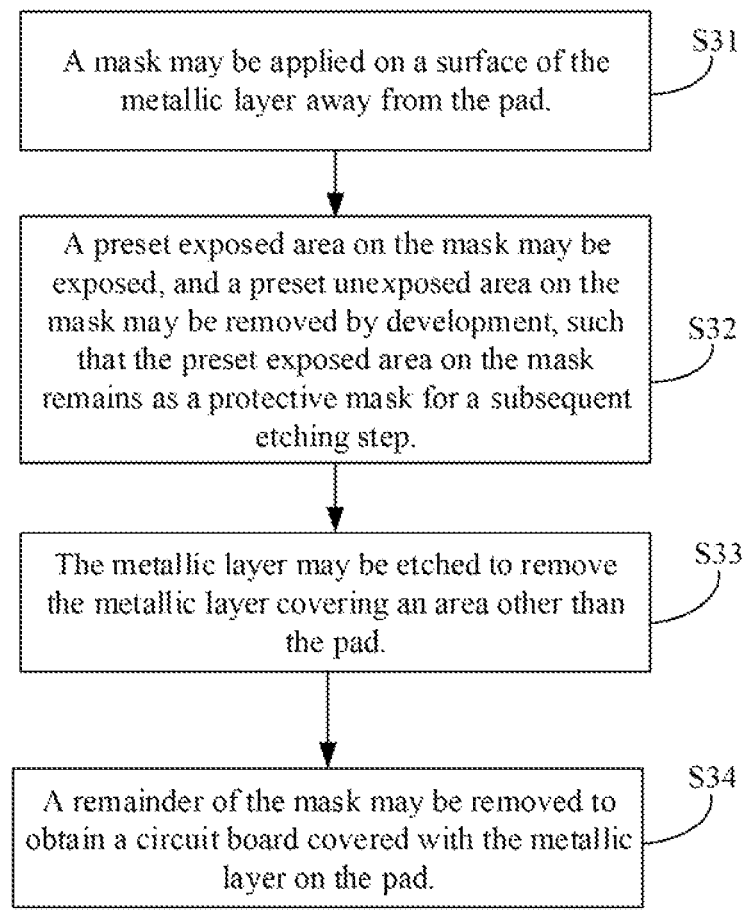
FIG. 4 is a schematic flowchart of a second embodiment of a method for manufacturing an embedded circuit board according to the present disclosure.

Referring to FIG. 4, the above operations at block S30 may include the following.

At block S31, a mask may be applied on a surface of the metallic layer away from the pad.

Mask production is carried out on the metallic layer, and a mask is formed only on a surface of the metallic layer away from the pad. The mask produced covers a surface of the metallic layer away from the pad.

At block S32, a preset exposed area on the mask may be exposed, and a preset unexposed area on the mask may be removed by development, such that the preset exposed area on the mask remains as a protective mask for a subsequent etching step.

The mask includes a preset exposed area and a preset unexposed area. In the operations, after the preset exposed area is exposed, the developer can be used to develop the preset unexposed area, and the mask of the preset unexposed area can be removed to retain the preset exposed area on the mask.

At block S33, the metallic layer may be etched to remove the metallic layer covering an area other than the pad.

The preset exposed area may be used as a mask plate, and the metallic layer corresponding to the area other than the pad is etched away by photolithography, dry etching or wet etching, such that the metallic layer corresponding to the pad remains.

At block S34, a remainder of the mask may be removed to obtain a circuit board covered with the metallic layer on the pad.

A remainder of the mask is peeled off to obtain a circuit board covered with the metallic layer on the pad.

Figure 5:
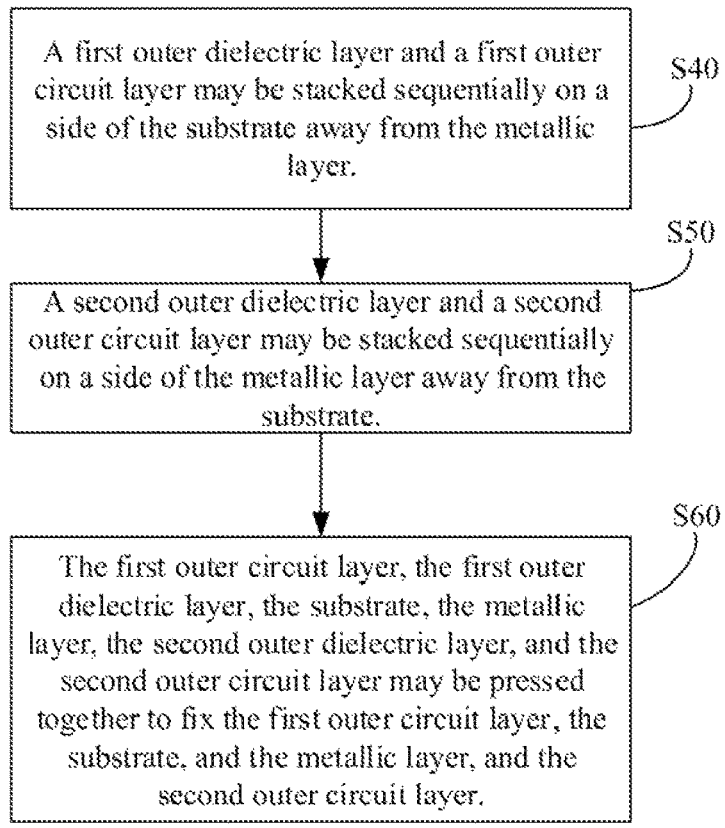
FIG. 5 is a schematic flowchart of a third embodiment of a method for manufacturing an embedded circuit board according to the present disclosure.

Referring to FIG. 5, after the above operations at block S30, the method further includes the following.

At block S40, a first outer dielectric layer and a first outer circuit layer may be stacked sequentially on a side of the substrate away from the metallic layer.

At block S50, a second outer dielectric layer and a second outer circuit layer may be stacked sequentially on a side of the metallic layer away from the substrate.

At block S60, the first outer circuit layer, the first outer dielectric layer, the substrate, the metallic layer, the second outer dielectric layer, and the second outer circuit layer may be pressed together to fix the first outer circuit layer, the substrate, and the metallic layer, and the second outer circuit layer.

Specifically, the substrate may be placed within a dedicated mold, and the first outer dielectric layer and the second outer dielectric layer are laid on two upper and lower surfaces of the substrate, respectively. The first outer circuit layer may be arranged on the first outer dielectric layer, and the second outer circuit layer may be arranged on the second outer dielectric layer. The first outer circuit layer, the first outer dielectric layer, the substrate, the metallic layer, the second outer dielectric layer, and the second outer circuit layer may be pressed together. Therein, the first outer dielectric layer and the second outer dielectric layer are melted to bond the substrate to the first outer circuit layer and the second outer circuit layer together.

The first outer dielectric layer and the second outer dielectric layer are made of an insulating material selected from the group consisting of resin and silica gel, or any combination thereof.

Specifically, resin refers to an organic polymer, which has a softening or melting range after being heated, has a tendency to flow with an external force when softened and has a solid, semi-solid, or liquid state (sometimes) at an ambient temperature. The resin may be an adhesive system such as epoxy resin, silicone resin, polyimide resin, phenolic resin, polyurethane, or acrylic resin. Silica gel, which is a colorless and transparent liquid and can be vulcanized at a high temperature above 150° C., has some air permeability and elasticity, when solidified, and is mainly featured by temperature resistance, weather resistance, electrical insulation, physiological inertia, low surface tension and low surface energy.

Further, materials of the first outer dielectric layer and the second outer dielectric layer may be materials with high heat dissipation, magnetic materials or materials with low transmission loss. When the materials of the first outer dielectric layer and the second outer dielectric layer are materials with high heat dissipation, heat dissipation performance of the embedded circuit board can be improved. When the materials of the first outer dielectric layer and the second outer dielectric layer are magnetic materials, electromagnetic shielding may be achieved. When the materials of the first outer dielectric layer and the second outer dielectric layer are materials with low transmission loss, transmission of radio frequency signals and high frequency signals may be improved.

With reference to FIG. 6, after the above operations at block S60, the method further includes the following.

At block S70, the second outer circuit layer and the second outer dielectric layer may be laser-drilled to form a laser through-hole penetrating through the second outer circuit layer and dielectric layer.

At block S80, the laser through-hole may be filled with a conductive column. The conductive column contacts the second metallic layer, such that the electronic component is electrically connected to the second outer circuit layer through the pad, the metallic layer and the conductive column.

Referring to FIG. 7, an embodiment of the present disclosure provides an embedded circuit board 100. The embedded circuit board 100 includes a substrate 10, an electronic component 20 and a metallic layer 30. The substrate 10 defines a slot 101 receiving the electronic component 20. Therein, a pad 40 is arranged on a side surface of the electronic component 20, and an end surface of the pad 40 is flush with a same side surface of the substrate 10. The metallic layer 30 covers at least the pad 40, and protrudes beyond the same side surface of the substrate 10.

Specifically, the substrate 10 may be a single-layer plate or a multi-layer plate. The single-layer plate may be a copper-free core plate or a copper clad plate, and the multi-layer plate may be directly manufactured by laminating a plurality of copper-free core plates or copper clad plates. The purpose of choosing a copper-free core plate as the substrate 10 is to thicken the embedded circuit board 100 to embed the electronic component 20 with a sufficient thickness. Of course, a copper clad plate can also be chosen as the substrate 10. The copper clad plate may be provided with a circuit for circuit connection.

The substrate 10 may define a slot 101 for receiving the electronic component 20. A size of the slot 101 may be determined according to a size of the electronic component 20 to be received. Generally, the size of the slot 101 may be greater than that of the electronic component 20. To be specific, the size of the slot 101 in the thickness direction of the substrate 10 may be greater than that of the electronic component 20. Thus, the substrate 10 may provide protection for the electronic component 20 during subsequent treatment, by reducing a pressure applied to the electronic component 20 during the treatment process. The size of the slot 101 in a direction perpendicular to the thickness direction of the substrate 10 may be greater than the size of the electronic component 20 such that the electronic component 20 may be precisely received in the slot without being damaged. The pad 40 is arranged on a side surface of the electronic component 20, and an end surface of the pad 40 is flush with a same side surface of the substrate 10. The pad 40 is configured to connect the electronic component 20 and a circuit layer in the embedded circuit board 100.

In an embodiment, the metallic layer 30 on the pad 40 protrudes beyond the same side surface of the substrate 10 by 5um. Preferably, the metallic layer 30 on the pad 40 protrudes beyond the same side surface of the substrate 10 by 5 um to 13 um (e.g., 3 um, 5 um, 9 um, or 3 um). More preferably, the metallic layer 30 on the pad 40 protrudes beyond the same side surface of the substrate 10 by 5um.

In an embodiment, the metallic layer 30 includes a first metallic layer 30A, a second metallic layer 30B, and a third metallic layer 30C that are sequentially stacked on the pad 40. Therein, a thickness of the first metallic layer 30A may range from 0.1 un to 0.2 um (e.g., 0.1 um, 0.12 um, 0.16 um or 0.2 um), a thickness of the second metallic layer 30B may range from 0.3 um to 0.8 um (e.g., 0.3 um, 0.5 um, 0.7 um or 0.8 um), and a thickness of the third metallic layer 30C may range 5 um to 11 um (e.g., 5 um, 7 um, 9 um or 11 um).

A material of the second metallic layer 30B is the same as a material of the third metallic layer 30C. Further, a material of the pad 40 is aluminum; a material of the first metallic layer 30A is titanium; a material of the second metallic layer 30B is copper; and a material of the third metallic layer 30C is copper.

In the present embodiment, an isolated titanium layer is formed on the aluminum foil pad 40, and then a copper circuit layer is formed on the isolated titanium layer to avoid forming the aluminum copper alloy with high resistance by direct welding of the aluminum foil pad 40 and the copper circuit layer. Thus, better heat dissipation effect for electronic devices may be achieved, and an embedded circuit board 100 meeting the heat dissipation requirements of users may be manufactured.

The embedded circuit board 100 further includes a first outer circuit layer 50, a second outer circuit layer 60, a first outer dielectric layer 71, and a second outer dielectric layer 72. The first outer circuit layer 50 and the second outer circuit layer 60 are arranged on two opposite sides of the substrate 10. Moreover, the second outer circuit layer 60 covers the metallic layer 30, the first outer dielectric layer 71 is disposed between the first outer circuit layer 50 and the substrate 10; and the second outer dielectric layer 72 is disposed between the second outer circuit layer 60 and the substrate 10.

The first outer dielectric layer 71 and the second outer dielectric layer 72 are made of an insulating material selected from the group consisting of resin and silica gel, or any combination thereof. Specifically, resin refers to an organic polymer, which has a softening or melting range after being heated, has a tendency to flow with an external force when softened and has a solid, semi-solid, or liquid state (sometimes) at an ambient temperature. The resin may be an adhesive system such as epoxy resin, silicone resin, polyimide resin, phenolic resin, polyurethane, or acrylic resin. Silica gel, which is a colorless and transparent liquid and can be vulcanized at a high temperature above 150° C., has some air permeability and elasticity, when solidified, and is mainly featured by temperature resistance, weather resistance, electrical insulation, physiological inertia, low surface tension and low surface energy.

Further, materials of the first outer dielectric layer 71 and the second outer dielectric layer 72 may be materials with high heat dissipation, magnetic materials or materials with low transmission loss. When the materials of the first outer dielectric layer 71 and the second outer dielectric layer 72 are materials with high heat dissipation, heat dissipation performance of the embedded circuit board 100 can be improved. When the materials of the first outer dielectric layer 71 and the second outer dielectric layer 72 are magnetic materials, electromagnetic shielding may be achieved. When the materials of the first outer dielectric layer 71 and the second outer dielectric layer 72 are materials with low transmission loss, transmission of radio frequency signals and high frequency signals may be improved.

Optionally, at least one component (not shown) may be set on a side of the first outer circuit layer 50 away from the substrate 10 or on a side of the second outer circuit layer 60 away from the substrate 10. The components implement electrical connection to the electronic component 20 through at least one of the first outer circuit layer 50 and the second outer circuit layer 60. Therein, the components can be one or more of chips, capacitance elements, and resistance elements.

Further, the embedded circuit board 100 further includes a conductive hole 80 penetrating through the first outer dielectric layer 71, the substrate 10 and the second outer dielectric layer 72. The metallic layer 30 further covers the same side surface of the substrate 10 that is flush with the end surface of the pad 40, and is connected to the conductive hole 80, such that the electronic component 20 is electrically connected to at least one of the first outer circuit layer 50 and the second outer circuit layer 60 through the pad 40, the metallic layer 30 and the conductive hole 80 in sequence.

Specifically, positions corresponding to the first outer dielectric layer 71, the substrate 10, and the second outer dielectric layer 72 may be patterned, to open a through hole in the first outer dielectric layer 71, the substrate 10, and the second outer dielectric layer 72. The through hole is subjected to copper electroplating to form a conductive layer on an inner wall of the through hole to obtain a conductive hole 80, thereby realizing electrical connection of the electronic component 20 to at least one of the first outer circuit layer 50 and the second outer circuit layer 60 through the pad 40, the metallic layer 30 and the conductive hole 80 in sequence.

Figure 8:
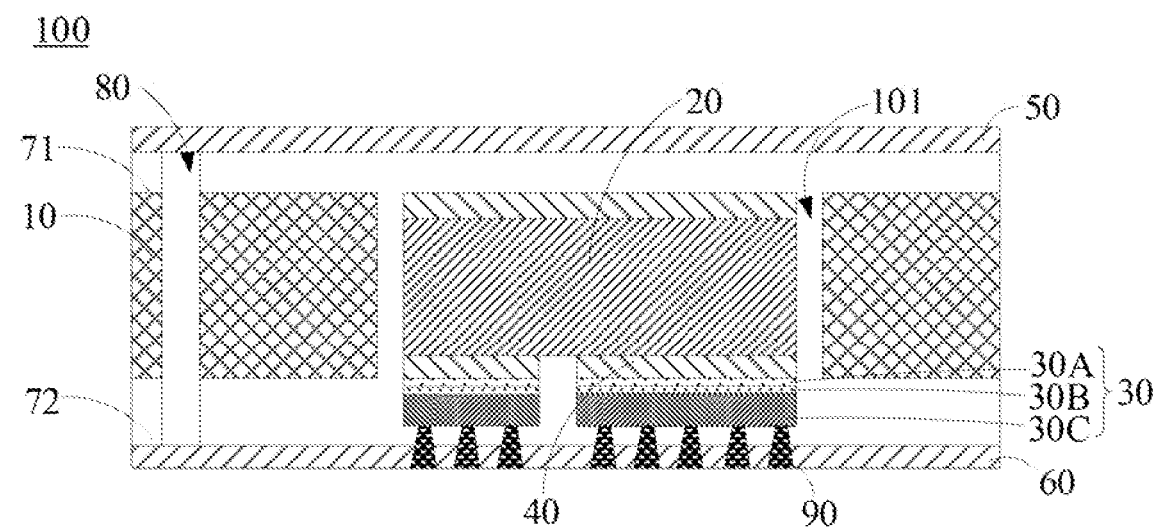
FIG. 8 is a schematic structural diagram of a second embodiment of an embedded circuit board according to the present disclosure.

Referring to FIG. 8, in an embodiment, the metallic layer 30 only covers the pad 40; and the embedded circuit board 100 further includes a laser through-hole penetrating through the second outer circuit layer 60 and the second outer dielectric layer 72. Therein, the laser through-hole is filled with conductive columns 90 electrically connecting the metallic layer 30 and the second outer circuit layer 60, such that the electronic component 20 is electrically connected to the second outer circuit layer 60 through the pad 40, the metallic layer 30 and the conductive columns 90 in sequence.

Specifically, a laser through-hole is provided at each of corresponding positions of the second outer circuit layer 60 and the second outer dielectric layer 72, and conductive columns 90 are provided in the laser through-holes. The electronic component 20 is electrically connected to the second outer circuit layer 60 through the pad 40, the metallic layer 30, and the conductive columns 90 in sequence.

Further, the embedded circuit board 100 further includes a conductive hole 80 penetrating through the first outer dielectric layer 71, the substrate 10, and the second outer dielectric layer 72, such that the electronic component 20 is electrically connected to the first outer circuit layer 50 through the pad 40, the metallic layer 30, the conductive column 90, the second outer circuit layer 60 and the conductive hole 80 in sequence.

Figure 9:
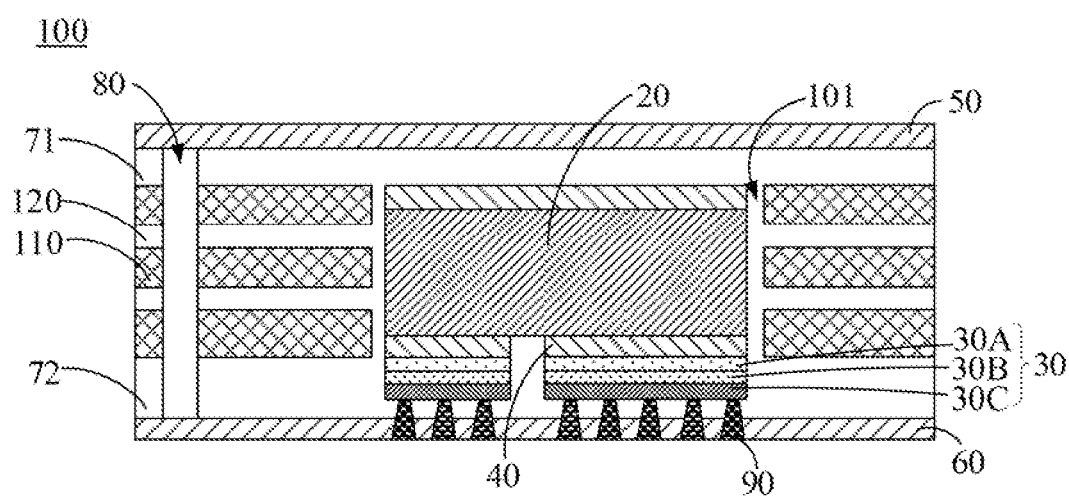
FIG. 9 is a schematic structural diagram of a third embodiment of an embedded circuit board according to the present disclosure.

Referring to FIG. 9, in an embodiment, the substrate 10 includes a plurality of sub-layers 110 and a plurality of dielectric layers 120 alternately stacked in sequence. Therein, the plurality of sub-layers 110 and the plurality of dielectric layer 120 are provided with a slot 101 in which the electronic component 20 is embedded.

Specifically, the sub-bodies 110 may be copper-free core plates or copper clad plates. The purpose of choosing the sub-bodies 110 to be copper-free core plates is to thicken the embedded circuit board 100 to embed the electronic component 20 with a sufficient thickness. Of course, the sub-bodies 110 can also be chosen to be copper clad plates on which circuits may be provided for circuit connection.

A dielectric layer 120 is provided between adjacent sub-bodies 110. During the pressing, at least a part of the dielectric layer 120 flows into between the electronic component 20 and the sidewall of the slot 101 and contacts the electronic component 20, thereby bonding the respective sub-layers 110 and the electronic component 20 together.

The present disclosure further provides an application of the embedded circuit board 100 as in the foregoing embodiments to a mobile device, an automobile device, a base station device or a sensor assembly.

The present disclosure further provides a mobile device, an automobile device, a base station device, or a sensor assembly, including the embedded circuit board 100 as in the foregoing embodiments.

The foregoing are merely embodiments of the present disclosure, and do not thus limit the patent scope of the present disclosure. Any equivalent structure or equivalent process transformation made using contents of the specification and drawings of the present application, or applied directly or indirectly to other related technical fields, shall likewise be included within the scope of patent protection of the present disclosure.

What is claimed is:

1. A method for manufacturing an embedded circuit board, comprising:
   providing a substrate, wherein an electronic component is embedded in the substrate, a pad is arranged on a side surface of the electronic component, and an end surface of the pad is flush with a same side surface of the substrate;
   forming a metallic layer on a side surface of the substrate adjacent to the pad by sputtering, evaporation, electroplating or chemical vapor deposition; and
   patterning the metallic layer to obtain a circuit board covered with the metallic layer on the pad, wherein the metallic layer on the pad protrudes beyond the same side surface of the substrates;
   wherein after patterning the metallic layer to obtain a circuit board covered with the metallic layer on the pad, the method further comprises:
   sequentially stacking a first outer dielectric layer and a first outer circuit layer on a side of the substrate away from the metallic layer;
   sequentially stacking a second outer dielectric layer and a second outer circuit layer on a side of the metallic layer away from the substrate; and
   pressing the first outer circuit layer, the first outer dielectric layer, the substrate, the metallic layer, the second outer dielectric layer, and the second outer circuit layer together to fix the first outer circuit layer, the substrate, the metallic layer and the second outer circuit layer; and
   wherein after pressing the first outer circuit layer, the first outer dielectric layer, the substrate, the metallic layer, the second outer dielectric layer, and the second outer circuit layer together, the method further comprises:
   laser-drilling the second outer circuit layer and the second outer dielectric layer to form a laser through-hole penetrating the second outer circuit layer and the dielectric layer; and
   filling the laser through-hole with a conductive column, wherein the conductive column contacts the second metallic layer, such that the electronic component is electrically connected to the second outer circuit layer through the pad, the metallic layer, and the conductive column.

2. An embedded circuit board, comprising:
   a substrate defining a slot;
   an electronic component received in the slot, wherein a pad is arranged on a side surface of the electronic component, and an end surface of the pad is flush with a same side surface of the substrate; and a metallic layer at least covering the pad, wherein the metallic layer protrudes beyond the same side surface of the substrate;

wherein the embedded circuit board further comprises:

a first outer circuit layer disposed on one side of the substrate and a second outer circuit layer disposed on an opposite side of the substrate, wherein the second outer circuit layer covers the metallic layer;

a first outer dielectric layer disposed between the first outer circuit layer and the sub state;

a second outer dielectric layer disposed between the second outer circuit layer and the substrate; and a conductive hole penetrating through the first outer dielectric layer, the substrate, and the second outer dielectric layer; and wherein the metallic layer further covers a same side surface of the substrate flush with an end surface of the pad, and is connected to the conductive hole, such that the electronic component is electrically connected to at least one of the first outer circuit layer and the second outer circuit layer through the pad, the metallic layer and the conductive hole in sequence.

3. The embedded circuit board according to claim 2, wherein the metallic layer on the pad protrudes beyond the same side surface of the substrate by more than 5 μm.

4. The embedded circuit board according to claim 3, wherein the metallic layer on the pad protrudes beyond the same side surface of the substrate by 5 μm to 13 μm.

5. The embedded circuit board according to claim 4, wherein the metallic layer on the pad protrudes beyond the same side surface of the substrate by 8 μm.

6. The embedded circuit board according to claim 5, wherein the metallic layer comprises the first metallic layer, the second metallic layer, and the third metallic layer sequentially stacked on the pad.

7. The embedded circuit board according to claim 6, wherein a material of the pad is aluminum;
a material of the first metallic layer is titanium;
a material of the second metallic layer is copper; and
a material of the third metallic layer is copper.

8. The embedded circuit board according to claim 6, wherein:

a thickness of the first metallic layer ranges from 0.1 μm to 0.2 μm;

a thickness of the second metallic layer ranges from 0.3 μm to 0.8 μm; and a thickness of the third metallic layer ranges from 5 μm to 11 μm.

9. The embedded circuit board according to claim 2, wherein the metallic layer only covers the pad, and wherein the embedded circuit board further comprises:

a laser through-hole penetrating through the second outer circuit layer and the second outer dielectric layer, wherein the laser through-hole is filled with a conductive column, the conductive column electrically connecting the metallic layer and the second outer circuit layer, such that the electronic component is electrically connected to the second outer circuit layer through the pad, the metallic layer and the conductive column in sequence.

10. The embedded circuit board according to claim 9, wherein the embedded circuit board further comprises:

a conductive hole penetrating through the first outer dielectric layer, the substrate, and the second outer dielectric layer, such that the electronic component is electrically connected to the first outer circuit layer through the pad, the metallic layer, the conductive column, the second outer circuit layer and the conductive hole in sequence.

11. The embedded circuit board according to claim 2, wherein the substrate comprises a plurality of sub-layers and a plurality of dielectric layers alternately stacked in sequence, wherein the plurality of sub-layers and the plurality of dielectric layers define the slot for receiving the electronic component.

* * * * *